(12) United States Patent
Sueyoshi et al.

(10) Patent No.: US 8,014,887 B2
(45) Date of Patent: Sep. 6, 2011

(54) SUBSTRATE PROCESSING APPARATUS

(75) Inventors: Masako Sueyoshi, Toyama (JP);
Kazuhito Saito, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 291 days.

(21) Appl. No.: 12/224,858

(22) PCT Filed: Mar. 13, 2007

(86) PCT No.: PCT/JP2007/055004
§ 371 (c)(1),
(2), (4) Date: Sep. 8, 2008

(87) PCT Pub. No.: WO2007/108370
PCT Pub. Date: Sep. 27, 2007

(65) Prior Publication Data
US 2009/0024238 A1   Jan. 22, 2009

(30) Foreign Application Priority Data

Mar. 22, 2006   (JP) .................. 2006-078561

(51) Int. Cl.
*G06F 19/00* (2006.01)
*G05B 11/01* (2006.01)
*G05B 15/00* (2006.01)
*G08B 25/00* (2006.01)
*G08B 23/00* (2006.01)

(52) U.S. Cl. ............... 700/108; 700/15; 700/17; 700/83; 700/104; 700/174; 340/525; 340/527; 345/1.2; 345/1.3; 345/33

(58) Field of Classification Search .................... 700/17, 700/19–20, 95–96, 104, 108, 121, 169, 173–174, 700/15–16, 83; 702/182–185, 188; 715/200; 340/525, 527; 345/1.2, 1.3, 33
See application file for complete search history.

(56) References Cited

U.S. PATENT DOCUMENTS

| 5,555,195 | A  | * | 9/1996 | Jensen et al. ................... 700/276 |
| 5,591,299 | A  | * | 1/1997 | Seaton et al. .................. 700/121 |
| 6,233,492 | B1 | * | 5/2001 | Nakamura et al. ................ 700/2 |
| 6,363,294 | B1 | * | 3/2002 | Coronel et al. ............... 700/121 |
| 6,424,880 | B1 | * | 7/2002 | Goder et al. .................. 700/121 |
| 6,445,443 | B1 | * | 9/2002 | Park et al. ....................... 355/77 |

(Continued)

FOREIGN PATENT DOCUMENTS

JP   A-07-335539   12/1995

(Continued)

*Primary Examiner* — Ramesh B Patel
(74) *Attorney, Agent, or Firm* — Oliff & Berridge, PLC

(57) ABSTRACT

A substrate processing apparatus includes an operating section. The operating section includes a display unit having an operation screen, a screen file that stores daily check data monitor screen data in which a row number is settable as a data number, and a data name is settable as item data of a daily check. The operating section further includes a daily check initial parameter file that stores parameter data corresponding to the item data. The operating section displays the daily check data monitor screen data by extracting the screen file and placing the daily check data monitor screen data on the operation screen as a daily check data monitor screen, and by extracting the daily check initial parameter file, searching through the daily check initial parameter file based on the data number, and placing parameter data corresponding to the item data on the operation screen as the daily check data monitor screen.

20 Claims, 10 Drawing Sheets

U.S. PATENT DOCUMENTS

| | | | |
|---|---|---|---|
| 6,606,524 B1 * | 8/2003 | Byun et al. | 700/19 |
| 6,990,380 B2 * | 1/2006 | Yoshimoto et al. | 700/20 |
| 2001/0001839 A1 * | 5/2001 | Lin et al. | 700/121 |
| 2002/0130262 A1 * | 9/2002 | Nakasuji et al. | 250/311 |
| 2007/0004052 A1 * | 1/2007 | Wada et al. | 438/5 |
| 2007/0203586 A1 * | 8/2007 | Sakurai | 700/3 |
| 2007/0293970 A1 * | 12/2007 | Aiuchi et al. | 700/114 |

FOREIGN PATENT DOCUMENTS

| | | |
|---|---|---|
| JP | A-08-045806 | 2/1996 |
| JP | A-2001-332463 | 11/2001 |
| JP | A-2002-353085 | 12/2002 |

* cited by examiner

FIG.8

INTERLOCK VALUE

Cooling Water Flow Rate  [ 0.10 ] l/min    [ 0.05 ] or below

Cooling Water Pressure   [ 100 ] Pa       [ 90 ] or below

| No. | NAME | FULL SCALE | UNIT | UPPER LIMIT VALUE | LOWER LIMIT VALUE |
|---|---|---|---|---|---|
| 6 | Driving Air Pressure Switch | 10 | MPa | 8 | 5 |
| 7 | | | | | |
| 8 | | | | | |
| 9 | | | | | |
| 10 | | | | | |
| ⋮ | | | | | |

(b)

| No. | NAME | FULL SCALE | UNIT | UPPER LIMIT VALUE | LOWER LIMIT VALUE |
|---|---|---|---|---|---|
| 6 | Driving Air Pressure Switch | 20 | MPa | 16 | 10 |
| 7 | | | | | |
| 8 | | | | | |
| 9 | | | | | |
| 10 | | | | | |
| ⋮ | | | | | |

| No. | NAME | FULL SCALE | UNIT | UPPER LIMIT VALUE | LOWER LIMIT VALUE |
|---|---|---|---|---|---|
| 6 | | | | | |
| 7 | Gas 1 Supply Pressure Gauge | 5 | MPa | 0.05 | 0.02 |
| 8 | Gas 2 Supply Pressure Gauge | 5 | MPa | 0.02 | 0.01 |
| 9 | | | | | |
| 10 | | | | | |
| : | | | | | |

(b)

| No. | NAME | FULL SCALE | UNIT | UPPER LIMIT VALUE | LOWER LIMIT VALUE |
|---|---|---|---|---|---|
| 6 | Gas 1 Supply Pressure Gauge | | | | |
| 7 | | 5 | MPa | 0.02 | 0.01 |
| 8 | Gas 2 Supply Pressure Gauge | N/A | MPa | N/A | N/A |
| 9 | | | | | |
| 10 | | | | | |
| : | | | | | |

| No. | NAME | FULL SCALE | UNIT | UPPER LIMIT VALUE | LOWER LIMIT VALUE |
|---|---|---|---|---|---|
| 6 | | | | | |
| 7 | | | | | |
| 8 | | | | | |
| 9 | Pump Current Value Monitor | N/A | A | N/A | N/A |
| 10 | | | | | |
| : | | | | | |

(b)

| No. | NAME | FULL SCALE | UNIT | UPPER LIMIT VALUE | LOWER LIMIT VALUE |
|---|---|---|---|---|---|
| 6 | | | | | |
| 7 | | | | | |
| 8 | | | | | |
| 9 | Pump Current Value Monitor | 28 | A | 20 | 10 |
| 10 | | | | | |
| : | | | | | |

SUBSTRATE PROCESSING APPARATUS

TECHNICAL FIELD

The present invention relates to a substrate processing apparatus and, in particular, to an operation screen for a substrate processing apparatus.

BACKGROUND ART

Generally, a substrate processing apparatus to which a wide variety of parts are connected requires the check on whether the parts are normally operating while the apparatus is running. However, in a factory for manufacturing a semiconductor device, utility equipment relating to the parts, that is, equipment for supplying electricity, water, gas and raw gas are placed under the floor lying the substrate processing apparatus, and an operator must leave the substrate processing apparatus for referring to utility data or checking the utility equipment. The utility equipment has a hard interlock, which is preferably checked periodically while the apparatus is running. However, the utility equipment is located at a remote place, which wastes the time to start the apparatus.

DISCLOSURE OF THE INVENTION

Problems that the Invention is to Solve

Accordingly, it is an object of the invention to allow display of daily check data, which is different for each client and/or for each apparatus, on an operation screen for a substrate processing apparatus in order to monitor data that requires daily check, such as utility data, by an apparatus controller including a control section and an operating section.

Means for Solving the Problems

The invention according to claim 1 is a substrate processing apparatus comprising a display unit having an operation screen, a first control section that transmits a control instruction for processing a substrate and a second control section that performs control according to the control instruction from the first control section, the first control section having a screen file that stores screen data in which the first row is settable as item data for a data number, a data name or the like, a parameter file that stores parameter data corresponding to the item data at least, and a display control section that displays the monitor screen by executing the screen file and placing the screen data on the operation screen as a monitor screen and executing the parameter file, searching through the parameter file based on the data number and placing the parameter data corresponding to the item data.

Advantage of the Invention

According to the invention, the first control section displays on a monitor screen by placing screen data in a table format storing expanded screen and parameter files in a screen file and the data corresponding to the item obtained by searching through the parameter file. By handling an item as a parameter on the screen in a table format in this way, the item can be changed freely. Therefore, items in a parameter file may be changed to support different clients or different machine types. As a result, different items for different clients and/or different machine types can be supported by changing items in the parameter file only.

In a case where the name of daily check data, for example, required for monitoring a substrate processing apparatus in the parameter file is displayed on the screen in a table format, the item becomes the item of the daily check data. Then, the item and the data corresponding to the item are placed on the screen in a table format, which are then displayed on the operation screen. On the display of the daily check data on the operation screen, a user can refer to the daily check data by monitoring the state of substrate processing at the same time. Therefore, an abnormality in or an check time for a machine or apparatus can be estimated.

Since not only data relating to substrate processing but also data requiring monitoring, such as daily check data, can be displayed on the operation screen for a substrate processing apparatus, an abnormality or problem in the apparatus can be estimated by monitoring data and performing the substrate processing at the same time. In a case where daily check data for measurement instruments scattered over utility facilities are displayed as data on the operation screen for referring at a time, the checking work on sites where the apparatus operate can be alleviated. Since an item prestored in the parameter file and the data corresponding to the item are displayed on the operation screen, no change is required in a program for displaying the screen even when the item is changed. Therefore, changing parameters is only required even if utility facilities differ among different machine types and/or different clients and even the items of an daily check vary widely, which greatly improves the general versatility.

BEST MODE FOR CARRYING OUT THE INVENTION

With reference to drawings, an embodiment of the invention will be described.

First of all, an outline of a substrate processing apparatus to which the invention is applied will be described with reference to FIGS. 1 and 2.

In a substrate processing apparatus to which the invention is applied, a FOUP (Front Opening Unified Pod, which will be called Pod, hereinafter) is used as a carrier that transfers a substrate such as a wafer. The front and back and left and right are based on FIG. 1 in the following description. In other words, on the paper showing FIG. 1, the front is the bottom of the paper, the back is the top of the paper and the left and right are the left and right of the paper.

As shown in FIGS. 1 and 2, the substrate processing apparatus has a first transfer chamber 103 in a load lock chamber structure resistant to the pressure (negative pressure) below atmospheric pressure such as a state under vacuum, and a cabinet 101 of the first transfer chamber 103 is shaped a box having a hexagon in a plan view and closed top and bottom ends. The first transfer chamber 103 has first wafer transfer equipment 112 that transfers a wafer 200 under negative pressure. The first wafer transfer equipment 112 is configured to be capable of moving up or down by an elevator 115, keeping the air-tightness of the first transfer chamber 103.

A spare room 122 for loading and a spare room 123 for unloading are connected to two side walls, which are positioned on the front side among the six side walls of the cabinet 101, through gate valves 244 and 127, and each has a load lock chamber structure resistant to negative pressure. The spare room 122 has a substrate stage 140 for a loading chamber, and the spare room 123 has a substrate stage 141 for an unloading chamber.

A second transfer chamber 121 to be used substantially under atmospheric pressure is connected to the front sides of the spare room 122 and spare room 123 through gate valves 128 and 129. The second transfer chamber 121 has second wafer transfer equipment 124 that transfers the wafer 200. The second wafer transfer equipment 124 is configured to be capable of moving up or down by an elevator 126 placed in the second transfer chamber 121 and is configured to be capable of reciprocating in the left and right directions by a linear actuator 132.

As shown in FIG. 1, a notch or orientation flat matching device 106 is placed on the left side of the second transfer chamber 121. As shown in FIG. 2, a clean unit 118 that supplies clean air is placed at the top of the second transfer chamber 121.

As shown in FIGS. 1 and 2, a wafer load/unload opening and a pod opener 108 for loading/unloading the wafer 200 to/from the second transfer chamber 121 are placed on the front side of the cabinet 125 of the second transfer chamber 121. An IO stage 105 is placed on the opposite side of the pod opener 108 across the wafer load/unload opening 134, that is, on the outside of the cabinet 125. The pod opener 108 has a closure 142 that opens and closes a cap 100a of the pod 100 and can close the wafer load/unload opening 134 and a driving mechanism 136 that drives the closure 142. The insertion/withdrawal of the wafer 200 to/from the pod 100 is allowed by opening/closing the cap 100a of the pod 100 mounted on the IO stage 105. The pod 100 is supplied to or ejected from the IO stage 105 by a rail guided vehicle (RGV), not shown. As shown in FIG. 1, a first furnace 202 and a second furnace 137 adjacent to each other are connected to the two side walls positioned on the rear side of the six side walls of the cabinet 101 through gate valves 130 and 131. The first furnace 202 and second furnace 137 perform a desired process on a wafer. Both of the first furnace 202 and second furnace 137 include a cold wall furnace, which is a process module. A first cooling unit 138 and a second cooling unit 139 are connected to the remaining two side walls, which face against each other, of the six side walls of the cabinet 101, and the first cooling unit 138 and the second cooling unit 139 are both configured to cool the processed wafer 200.

Processing steps using the substrate processing apparatus in the configuration above will be described below.

The twenty five unprocessed wafers 200 stored in the pod 100 are transferred to the substrate processing apparatus that performs processing steps by a rail guided vehicle. As shown in FIGS. 1 and 2, the carried pod 100 is supplied to and mounted on the IO stage 105 from the rail guided vehicle. The cap 10a of the pod 100 is removed by the pod opener 108, and the wafer load/unload opening of the pod 100 is opened.

After the pod 100 is opened by the pod opener 108, the second wafer transfer equipment 124 placed in the second transfer chamber 121 picks up the wafer 200 from the pod 100, loads it to the spare room 122 and transfers the wafer 200 to the substrate stage 140. During the transfer operation, the gate valve 244 on the first transfer chamber 103 side of the spare room 122 is closed, whereby the negative pressure within the first transfer chamber 103 is maintained. After the transfer of a predetermined number of, such as 25, wafers 200 stored in the pod 100 to the substrate stage 140 completes, the gate valve 128 is closed, and the spare room 122 is evacuated to a negative pressure by an exhaust (not shown).

When the pressure within the spare room 122 is equal to a predefined pressure value, the gate valve 244 is opened, and the spare room 122 and the first transfer chamber 103 are communicated. Then, the first wafer transfer equipment 112 in the first transfer chamber 103 picks up the wafer 200 from the substrate stage 140 and loads it to the first transfer chamber 103. After the gate valve 244 is closed, the gate valve 130 is opened, whereby the first transfer chamber 103 and the first furnace 202 are communicated. Then, the first wafer transfer equipment 112 loads the wafer 200 from the first transfer chamber 103 to the first furnace 202 and transfers it to a support within the first furnace 202. After the gate valve 130 is closed, processing gas is supplied into the first furnace 202, and a desired process is performed on the wafer 200.

After the process on the wafer 200 completes in the first furnace 202, the gate valve 130 is opened, and the processed wafer 200 is unloaded to the first transfer chamber 103 by the first wafer transfer equipment 112. After the unloading, the gate valve 130 is closed.

The first wafer transfer equipment 112 transfers the wafer 200 unloaded from the first furnace 202 to the first cooling unit 138, and the processed wafer is cooled.

After the processed wafer 200 is transferred to the first cooling unit 138, the first wafer transfer equipment 112 transfers the wafer 200 prepared on the substrate stage 140 in the spare room 122 to the first furnace 202, like the operation described above, and a desired process is performed on the wafer 200 within the first furnace 202.

After a lapse of a predefined cooling time in the first cooling unit 138, the cooled wafer 200 is unloaded from the first cooling unit 138 to the first transfer chamber 103 by the first wafer transfer equipment 112.

After the cooled wafer 200 is unloaded from the first cooling unit 138 to the first transfer chamber 103, the gate valve 127 is opened. The first wafer transfer equipment 112 transfers the wafer 200 unloaded from the first cooling unit 138 to the spare room 123 and transfers it to the substrate stage 141. After that, the spare room 123 is closed by the gate valve 127.

By repeating the operations above, a predetermined number of, such as 25, wafers 200 loaded into the spare room are sequentially processed.

After the processing on all of the wafers 200 loaded into the spare room 122 ends, all of the processed wafers 200 are stored in the spare room 123, and the spare room 123 is closed by the gate valve 127. Then, the inside of the spare room 123 is returned to a substantially atmospheric pressure by inert gas. After the inside of the spare room 123 is returned to a substantially atmospheric pressure, the gate valve 129 is opened, and the cap 100a of the empty pod 100 mounted on the IO stage 105 is opened by the pod opener 108. Then, the second wafer transfer equipment 124 in the second transfer chamber 121 picks up the wafer 200 from the substrate stage 141, unloads it to the second transfer chamber 121 and stores it to the pod 100 through the wafer load/unload opening 134 of the second transfer chamber 121. After the storage of the 25 processed wafers 200 to the pod 100 completes, the cap 100a of the pod 100 is closed by the pod opener 108. The closed pod 100 is transferred to the next step from the top of the IO stage 105 by the rail guided vehicle.

Having described the example of the operations described above using the first furnace 202 and the first cooling unit 138, the same operations are performed also in a case using the second furnace 137 and the second cooling unit 139. In the substrate processing apparatus above, the spare room 122 is for loading, and the spare room 123 is for unloading. However, the spare room 123 may be for loading, and the spare room 122 may be for unloading.

The first furnace 202 and the second furnace 137 may perform a same process or different processes. In a case where the first furnace 202 and the second furnace 137 perform different processes, one process may be performed on the wafers 200 by the first furnace 202, and a different process may then be performed thereon by the second furnace 137. Alternatively, in a case where one processing is performed on the wafers 200 by the first furnace 202 and a different process is performed thereon by the second furnace 137, the wafers may pass through the first cooling unit 138 or second cooling unit 139.

Furthermore, as shown in FIG. 3, the substrate processing apparatus includes an apparatus controller 12 having an operating section 10 and a control section 11. Multiple sub-controllers (control section controllers) for controlling substrate processing are connected to the control section 11.

The sub-controllers may include a mechanism controller, a temperature controller, a pressure controller and a gas controller for a mass flow controller (MFC), for example. The mechanism controller may control the first wafer transfer equipment 112, the second wafer transfer equipment 124, the linear actuator 132, the gate valves 244 and 127, the elevator 126, the notch or orientation flat matching device 106, the rail guided vehicle and so on in the substrate processing apparatus to perform the transfer and/or handling of the wafers 200. The temperature controller adjusts the temperature of a heater for each of a process module that the first furnace 202 has and a process module that the second furnace 137 has. The pressure controller controls the degree of opening of an exhaust control valve that reduces pressure in the first furnace 202 and the second furnace 137 etc by evacuation of the exhaust. The gas controller adjusts the flow rates of raw gas, dilute gas and carrier gas to the first furnace 202 and the second furnace 137. The sub-controllers perform control corresponding to a control instruction from an operation screen on a monitor 15 of the apparatus controller 12.

The apparatus controller 12 has a hard disk (not shown) functioning as a fixed storage apparatus and memories 13 and 14 for primary storage of programs and/or for data reference, and a keyboard functioning as an input unit and the monitor 15 functioning as a display unit are connected to the operating section 10. The hard disk stores an initial program (not shown) to be executed upon start of the apparatus controller 12, a screen file 22 that stores screens for performing substrate control over the substrate processing apparatus and a required program (not shown) such as a recipe file for automating substrate processing. The screens to be displayed on the monitor 15 include a screen to be invoked from the screen file 22 first by the execution of the initial program loaded from the hard disk upon start of the apparatus controller 12 by the operating section 10, the screen for each process module to be invoked from the screen file 22 by switching the screens through a button displayed on the former screen, and a screen for operating a transfer system and/or a handling system of the entire substrate processing apparatus according to a control instruction to the mechanism controller.

The operation screens for each process module of the substrate processing apparatus may include a recipe editing screen and/or a screen for performing a substrate process by the execution of a recipe, and the screens are switched by switching buttons.

Here, the control instructions from the operation screens may refer to outputting control signals for set values (target values) required for substrate processes, such as the set temperature, set pressure and set flow rate, which are set for each recipe to the sub-controllers responsible for the execution of the substrate processes by the temperature controller, pressure controller and mass flow controller by the execution of the recipe on the process modules of the substrate processing apparatus or outputting set values (target values) to the transfer (atmospheric transfer or vacuum transfer) and/or handling systems for wafers to the mechanism controller based on a recipe.

Next, with reference to FIGS. 3 to 8, a processing system will be described which displays utility data on an operation screen of the monitor 15.

FIG. 7 is a diagram showing processing of displaying utility data to be performed with a screen and a parameter file by a program of the operating section according to a first embodiment of the invention.

As shown in FIG. 7, a control section 1 and a control section controller 2 are connected over a LAN (not shown). The control section controller 2 functions as a parts controller (sub-controller). Utility data is transmitted from the control section controller 2 to the control section 1. As shown in FIG. 7(a), the units of the utility data transmitted from the control section controller 2 are converted by a unit conversion program in the control section 1. Then, the utility data is transferred to an operating section 3, as shown in FIG. 7(b). The operating section 3 switches the screen to an operation screen 5 (FIG. 7(c)) by referring to the parameters defined in the client type (a), the presence of items (b) and unit conversion (c) of an initial parameter file 4 loaded upon start and causes to display daily check data on the operation screen 5. In FIG. 7, the symbol "PM" refers to a screen of a process module including a substrate processing furnace, and the symbol "MF (main frame)" refers to screens of a load lock module and a vacuum transfer module.

FIG. 8 is an example of the operation screen 5.

In this way, by displaying daily check data on the operation screen 5 (such as the flow rate of cooling water and the pressure of cooling water in the shown example), a user is allowed to refer to the daily check data by monitoring the state of substrate processing at the same time.

However, in a case where this system is applied to all of data for different clients, machine types and users, the existing screen display program installed in the system is to be extended, the screen files and unit conversion programs supporting the client type (a), presence of items (b) and unit conversion (c) are to be built in the program.

This may have effect on the existing system, but it is difficult to make the program support different clients. Therefore, unnecessary screen data and/or unit conversion programs must be installed in the system, and unnecessary data not to be displayed must be stored in the system.

For example, in a case where the display form of display data, that is, the number of display digits for the accuracy of a measuring instrument of daily check data, calculation results based on unit conversions, and the number of digits to be displayed on the screen (including the number of digits of the integer portion and the number of digits of the fractional portion of data) differ among systems based on the client specifications, the program in the operating section 3 is changed, and the daily check data transmitted from the control section 1 is converted to the data displayable by the program on the operating section 3 side for each data, as shown in FIG. 7(d), without the conversion of the data format in the control section 1. Here, the program must be changed for each client and for each type of the apparatus, such as the manufacturer and type of the pump, the form and display format of monitor data. Therefore, data not to be used at all in other systems remain in the system and become wasteful data.

As shown in FIG. 7(a), in a case where data is to be converted in the control section controller 2 and in a case where the input range (minimum value and maximum value) to the control section controller 2 is different, for example, in a case where Pa display is to be converted to KPa display, conversion is required. Therefore, the program must be changed.

FIG. 3 is a schematic diagram of a controller configuration according to a second embodiment of the invention. FIG. 4 is an explanatory diagram showing examples of the configuration of daily check data and the data display routine according to an embodiment of the invention.

As shown in FIG. 3, the operating section 10 and the control section 11 of the apparatus controller 12 are handled as a first control section, and the control section controller 16 functioning as a sub-controller (parts controller) for inputting daily check data to the control section 11 is handled as a second control section. The output sections of measurement instruments of utility facilities, such as a pressure gauge 18, a thermometer 19 and a pump 20, are connected to the control section controller 16 via a LAN and/or a cable. The utility facilities of the substrate processing apparatus are facilities required for allowing substrate processing, such as cooling equipment that supplies cooling water such as chiller water to a cooling unit of the substrate processing apparatus to obtain heat resistance, a power supply section that supplies power to a power supply facility of the substrate processing apparatus, purge gas supply equipment to be used for purging a substrate processing chamber, dilute gas supply equipment that dilutes raw gas, an external combustion apparatus for supplying gas oxide, and seal equipment that seals the seal part of the exhaust by seal gas ($N_2$ gas). The facilities are mainly provided by a factory side.

FIG. 3 shows the connection of the thermometer 19 that detects the temperature, the pressure gauge 18 that detects water pressure and the pump 20 that ejects the flow rate of cooling water of the cooling water equipment, which is a measurement instrument of typical utility facilities among them. The measurement instruments that measure other utility data, such as a wattmeter that detects utility data of the power supply unit and a flow rate detector and pressure gauge of gas supply equipment for purge gas, dilute gas and so on and the connection of hard interlocks provided in the measurement instruments are omitted in FIG. 3. The interlocks may include an interlock that transmits an interlock output to the control section controller 16 in a case where the maintenance door of the substrate processing apparatus is unlocked (not shown) and an interlock that outputs an interlock output to the control section controller 16 if the number of rotations of a pump unit (not shown) is higher than a preset number of rotations in a case where a bypass is provided in a main pipe of the pump unit.

The hard interlock output of the maintenance door, which is not required to always check in this way, is also connected to the control section controller 16 and is transmitted to the control section 11 as daily check data.

On the other hand, a memory management program that manages monitor data areas of the memory 13 of the operating section 10 and the memory 14 of the control section 11 can store 128 WORD-type data of two bytes in total in the monitor data areas of the memory 13 of the operating section 10 and the memory 14 of the control section 11 and assigns a preselected address to each type of each daily check data and stores the daily check data. The memory management program further updates the daily check data under each address of the control section 11 with new utility data transferred from the control section controller 16 at intervals of a predetermined period of time such as several seconds and transfers the updated daily check data to the same address in the memory 13 of the operating section 10 (FIG. 4, ((a)-1)). Thus, the daily check data in the memory 13 of the operating section 10 is updated to new daily check data transferred from the memory 14 of the control section 11 every predetermined period of time. The memory management program is further programmed to add the display position of each utility data (daily check data) of the memories 13 and 14 on a daily check data monitor screen 21 to each utility data in an n-rows-by-n-columns form. The operating section 10 displays it at the display position on the daily check data monitor screen 21 in the table form after converting daily check data (utility data) by a unit conversion equation, as will be described later.

FIG. 5 shows an example of the daily check data display program as a display control section, and FIG. 6 is an explanatory diagram showing details of the daily check data monitor screen 21 and a daily check initial parameter file.

The daily check data display program is a program to be executed by the operating section 10 and first performs [1] screen initialization processing and next performs [2] screen update processing, as shown in FIG. 5.

[1] Screen Initialization Processing

The screen initialization processing first loads daily check data monitor screen data 23 in an n-rows-by-n-columns table form in which data numbers, data names and so on, which will be set as item data through the screen file 22 (refer to FIGS. 3 and 6) of the hard disk of the apparatus controller 12 and expands it as the daily check data monitor screen 21 in the n-rows-by-n-columns table form on the operation screen 24 of the monitor 15, with a scroll bar placed on the right side of the paper. In order to eliminate the complexity and obtain good vision, the daily check data monitor screen 21 does not display the frame lines of cells at the first row and the divider lines between cells in the column direction at the two and subsequent rows, as shown in FIG. 6, but the format in which the frame lines and divider lines are displayed may be adopted. The daily check data display program places monitor screen 21 over the operation screen 24 so as to prevent the overlap with other objects (such as a figure, a table, a cell and text) on the operation screen 24 of the monitor 15 based on the layout information of the other objects. Then, the daily check data display program places row numbers and data numbers on the daily check data monitor screen 21 in the table format.

Next, daily check initial parameter files 25a and 25b shown as an example in FIG. 4 or 6 and the memory 14 of the operating section 10 are searched based on the array numbers, and the item data of the daily check data monitor screen 21 (refer to FIG. 4(b)) is obtained. Then, the item data is placed on the external frame line of the daily check data monitor screen 21 instead of the column number 23a of the daily check data monitor screen 21.

Here, the array numbers for searching the daily check initial parameter files 25a and 25b refer to data numbers DATA1, DATA2 and so on (refer to FIG. 6) of the daily check initial parameter files 25a and 25b corresponding to the data numbers No. 1, No. 2 and so on (refer to FIG. 4) on the daily check data monitor screen 21. The item data refers to the data to be displayed as items such as the name of data, a unit, an interlock value, an interlock value range, a permissible maximum value and a permissible minimum value.

The parameter data is a specific numerical value corresponding to the item data, obtained by searching the daily check initial parameter files 25a and 25b shown in FIGS. 4 and 6 based on the array number or the object data to be replaced (such as the numerical value, the flow rate of cooling water and 1/min shown in FIG. 6). The numerical values and data items in FIG. 4 are different from the expressions in FIG. 5, but they are just examples. In reality, the utility data corresponding to item data is determined for each film type, client type, machine type and specifications, as will be described later.

The array number for searching the memory 13 of the operating section 10 refers to the number corresponding to the data number DATA1, DATA 2 or the like assigned to each daily check data in advance by the memory management program.

Each of the daily check initial parameter files 25a and 25b defines a unit conversion equation corresponding to the unit conversion for daily check data and the display position of the parameter data on the daily check data monitor screen 21. The unit conversion equation and the display position are obtained by searching based on the array number. The display position of parameter data is given in an n-rows-by-n-columns form in advance, like daily check data in the memory.

Therefore, the item data, parameter data, display position of the parameter data and unit conversion equation for each daily check data may be obtained by searching the daily check initial parameter files 25a and 25b based on the array numbers. The utility data corresponding to an array number is obtained by searching the memory 13 of the operating section 10 based on the array number. Then, after the search for the item data, daily check data and so on ends, the daily check data display program places the item data functioning as a parameter such as a name (data name) and a unit and parameter data corresponding to the item data at display positions on the daily check data monitor screen 21 as shown in FIG. 6 based on the display positions on the daily check data monitor screen 21 and next allows the scroll by initializing a scroll bar 26. As a result, as shown in FIG. 6, the item data, "No." (data number), "NAME", "MONITOR VALUE", "UNIT", "INTERLOCK VALUE", "PERMISSIBLE VALUE (MAXIMUM)" and "PERMISSIBLE VALUE (MINIMUM)" are displayed from the left side to the right side of the paper at the top of cells in the row direction. The "Flow Rate of Cooling Water" and "Monitor Value (blank)", which are data names, "1/min", which is a unit, and "0.005 or below", which is an interlock value", are placed next to the next data number No. 1. The "Gas Supply Pressure" and "Monitor Value (blank)", which are data names, and "MPa", which is a unit, are placed next to the next data number No. 2. In the same manner, the "data name", "unit", "interlock value", "permissible value (maximum)" and "permissible value (minimum)" obtained by searching are placed therebelow.

[2] Screen Update Processing

The screen update processing performs unit conversion on the daily check data obtained by searching through the memory 13 of the operating section 10 (refer to FIG. 4(b)) by using a unit conversion equation for daily check data obtained by searching through the daily check initial parameter files 25a and 25b. Notably, in the example in FIG. 6, unit conversion is performed on the flow rate of cooling water, gas supply pressure, exhaust pressure, pump current value and the number of revolutions of the pump.

Next, the results of the unit conversion are placed on the daily check data monitor screen 21. In this case, the display position in the n-rows-by-n-columns form on the daily check data monitor screen 21 has been already given to daily check data when it is stored under an address in the memories 13 and 14. Therefore, the daily check data display program displays the conversion results at the display positions (refer to FIG. 4(c).

As a result, the daily check data after the unit conversion is placed at a cell at the display position for the monitor value on the daily check data monitor screen 21. Then, the screen update processing (2) repeats the unit conversion and the display of the result at intervals of a predetermined period of time and updates the monitor value displayed on the daily check data monitor screen 21.

Therefore, a user can monitor daily check data of the flow rate of cooling water, the pressure of cooling water and so on with reference to the interlock value and permissible values (maximum and minimum) on the operation screen 24 and can estimate the necessity and time for checks from the tendency of changes.

Next, steps of changing utility data corresponding to item data will be described. The change may include changes for different film types, client types, machine types and specifications.

[Example of Change for Different Specifications]

This change is required by the specification change in a system for a client utility after the substrate processing apparatus is delivered to the client. For example, a driving air pressure gauge may be required to replace due to a change in specifications of an air supply system for a client utility, and the full scale (that is, measurement range (measurement width)) of an actuator and upper and lower limit values of the full scale must be required to change therefore.

In this case, the "full scale", which is a parameter of a driving air pressure switch and the parameter data of the "upper limit value", and "lower limit value" of the "full scale" in the daily check initial parameter files 25a and 25b are rewritten. Thus, the full scale of the driving air pressure switch and the permissible range of the full scale are changed.

FIG. 9 shows an example of the daily check monitor screens before the change (that is, before the rewriting) and after the change (that is, after the rewriting).

While the parameter values of the full scale and upper and lower limit values in the daily check initial parameter files 25a and 25b are "10", "8" and "5", respectively, before rewriting, they are rewritten to "20", "16" and "10" when the daily check data display program is restarted. The parameter data of the parameters, which are not rewritten, such as "Mpa"are displayed in the same manner as those before rewriting.

[Example of Change for Different Film Types]

This change is performed when the film type is changed during substrate processing. For example, this change is performed in a case where the process using $N_2$ gas and Ar gas is changed to the process using one type of gas such as $NH_3$ due to a change in the process.

In this example, a gas 1 supply pressure gauge and a gas 2 supply pressure gauge are defined as item data of the name in the daily check initial parameter files 25a and 25b, and the parameter data of the parameters for the gas 1 supply pressure gauge and gas 2 supply pressure gauge are changed.

The parameters monitored by the gas 1 supply pressure gauge and gas 2 supply pressure gauge are the full scale of the flow rate and the upper and lower limit values of the flow rate.

The full scale and the upper and lower limit values for the pressure to the gas 1 supply pressure gauge in the daily check initial parameter data are rewritten, and the parameter data of the gas 2 supply pressure gauge are changed to "N/A". The "N/A" means that no control is performed.

FIG. 10 shows an example of the daily check monitor screens before and after change.

While the values of the full scale and upper limit and lower limit values of the pressure for the gas 1 supply pressure gauge are "5", "0.05" and "0.02" before change, the values of the full scale and upper limit and lower limit values of the pressure for the gas 1 supply pressure gauge are rewritten to "5", "0.10" and "0.01" when the daily check data display program is restarted. The parameter data for the gas 2 supply pressure gauge are rewritten to "N/A".

The flow rate stays the same since the gas supply pressure gauge is not changed but is used even with the change in gas type.

[In A Case Where Utility Equipment Is Changed to One by Different Manufacturer After Delivery to Client]

For example, this may be a case where an actuator without a monitor function is replaced by an actuator with a monitor function by a different manufacturer since the monitor function is required though required functions therein are the same. More specifically, this may be a case where a pump by a pump manufacture A without a monitor function for current values is changed to a pump having a monitor function for pump current values by a different manufacturer B.

In this case, the addition of parameters and the addition of parameter data are required to the daily check initial parameter files 25a and 25b. In the case of this example, item data (name) "Pump Current Value Monitor" and Parameters "full-scale" and "upper limit value" and "lower limit value" for a pump ammeter are added to the daily check initial parameter files.

FIG. 11 shows daily check monitor screens before and after change.

When the daily check data display program is restarted, no monitor function is provided, and parameters and parameter data of the item data "Pump Current Value Monitor", "Full-Scale" and "Upper Limit Value" and "Lower Limit Value" are not displayed before change as shown in FIG. 11(a). After change, as shown in FIG. 11(b), the parameters for "Pump Current Value Monitor", BR>U Full-Scale", "Upper Limit Value" and "Lower Limit Value" and "Unit" are displayed, and "28", "20", "10" and "A" corresponding to the parameters are displayed.

The invention according to this embodiment provides a programless structure (with transformation to a file form) and stores those excluding utility data (monitor values), such as a unit and the name of data and permissible values as parameters in the daily check initial parameter files 25a and 25b, which are obtained by searching. Furthermore, the display forms to be involved in unit conversion are stored in the daily check initial parameter files 25a and 25b in advance and are obtained by searching.

As a result, all of the parameters according to the first embodiment for each client, the presence of data items and unit conversion can be controlled by changing the data in the daily check initial parameter files 25a and 25b only. Therefore, like the monitoring system (FIG. 7) described as the first embodiment, unnecessary screen files and/or unit conversion equations are not required to store in the system, and unnecessary data do not remain in the system. The change based on the type of change is also allowed.

A user can always check utility data (parameter data) before processing a substrate. Therefore, unlike conventional cases and Embodiment 1, unnecessary termination of the apparatus can be suppressed because of the change on the operation screen.

According to the first embodiment, in order to convert the data display form, different processes are required in a case where the input range (minimum value and maximum value) from the control section controller 16 is different even for the same type of data to be displayed since the program of the control section controller 16 performs the conversion in a fixed manner. According to the second embodiment, as shown in FIG. 4, it can be addressed by parameter change. Furthermore, since the monitor data areas of the memories 13 and 14 store the same type of data and can store data freely if within the number of arrays, the change in precision of a measurement instrument or number of digits to be displayed (including the integer portion and fractional portion) can be easily supported. The list display also allows easy change of the name, unit and unit (monitor value) as item data, which is an advantage.

Next, with reference to FIG. 12, the screen display of daily check data and an alarm occurrence indication will be described.

In this example, the display area of one operation screen is divided into a main display area 50, a navigation button display area 51 and a tab button display area 52. The navigation button display area 51 is provided at the bottom of the operation screen. The tab button 53 is a button for switching daily check monitor screens to be displayed on the main display area 50.

The main display area 50 is a screen display part to be switched by the tab button 53 or other navigation button (which will also be called select button).

Each tab button 53 is linked with one daily check data monitor screen.

In this example, while the navigation button display area 51 displays a "System" button 54, a "PM1" button 55, a "PM2" button 56, a "Maintenance" button 57 and an "Alarm" button 58, other navigation buttons may be displayed as required.

The navigation buttons (select buttons) 54 to 58 are liked with corresponding screens or programs, and when touched, the liked screen may be invoked or the linked program is started.

In this example, when the "PM1" button 55 or "PM2" button 56 is touched, the screen for the process module liked therewith is invoked. When the "Maintenance" button 57 is touched, the maintenance screen is invoked.

Then, the "Alarm" button 58 flashes upon occurrence of an alarm, and the flashing by the other buttons 54 to 57 is inhibited.

Notably, the buttons 54 to 57 may be configured to change the color when touched.

FIG. 12 is an example of the alarm detail display screen to be displayed on the main display area 50 in response to the touch on the "Alarm" button 58. The alarm detail display screen is one of the daily check data monitor screens.

The parameters in the daily check initial data for an alarm message may include the "year, month and day (year, month and day of occurrence)", "time (time of occurrence)", "place of occurrence", "level (level of occurrence)", "message" and "details", for example, but other parameters may be added thereto as required.

The parameter data corresponding to the parameters are numerical values and/or text data.

In the example shown in FIG. 13, when the alarm button is touched, "2006/07/21", "00:00:03", "PM 1", "6", "Alarming a decrease in amount of chamber cooling water" and "0.08" are displayed as the parameter data corresponding to the parameters of the "year, month and day", "time", "place of occurrence", "level", "message" and "details", and, in the same manner, when the next alarm occurs, the parameter data "2006/07/21", "00:00:10", "PM 1", "2", "Alarming a decrease in amount of chamber cooling water" and "0.01" are displayed.

Notably, the parameter data to be displayed in the "details" is retrieved from a database.

The parameter data "place of occurrence" and/or the "level" and/or a monitor value, which is a cause of an alarm, may be used as the search operators. The actions after the occurrence of an alarm can be facilitated by the displayed action to be performed upon occurrence of an alarm message, recovery routine and detail information as descriptions of the "details" if any.

The alarm detail display screen illustrated in FIG. 13 means that:

(1) The amount of cooling water in PM1 is 0.08 liters beyond the alarm range, which causes the flow of cooling water, on "2006/07/21" and at "00:00:03"; and (2) is 0.01 liters beyond the alarm range, which causes the amount-of-cooling-water alarm, on "2006/07/21" and at "00:00:10", that is, seven seconds later.

In this way, an action can be taken quickly upon occurrence of an alarm since data required for the action can be obtained, such as the date and time, type, cause, level and details of the alarm, when an alarm button is touched.

The processing apparatus of the invention is applicable to not only a semiconductor producing apparatus but also an apparatus that processes a glass substrate such as an LCD apparatus. The film-forming processing may include CVD, PVD, processing that forms an oxide film or a nitride film and a film containing metal. The processing apparatus of the invention is not limited to a single wafer processing apparatus but is also applicable to horizontal or vertical processing apparatus. The invention does not directly relate to the processing within furnaces but is also applicable to oxidization, annealing, diffusion and so on. Item data, the centering or flush right or left for controlling the display of the daily check data and/or the numbers of digits of the integer and fractional portions of the daily check data may be defined in the daily initial parameter file for display. In this way, various modifications and alterations can be made to the invention, and it is apparent that the modified and/or altered invention is within the scope of the invention.

BRIEF DESCRIPTION OF THE DRAWINGS

[FIG. 8]
It is an example of a special operation screen in the monitoring system in FIG. 7.

[FIG. 9]
It is an explanatory diagram for explaining a change example for different specifications.

[FIG. 10]
It is an explanatory diagram for explaining a change example for different film types.

[FIG. 11]
It is an explanatory diagram for explaining a change example in a case where a part of utility equipment is changed to one by a different manufacturer.

DESCRIPTION OF REFERENCE NUMERALS AND SIGNS

Figure 1:
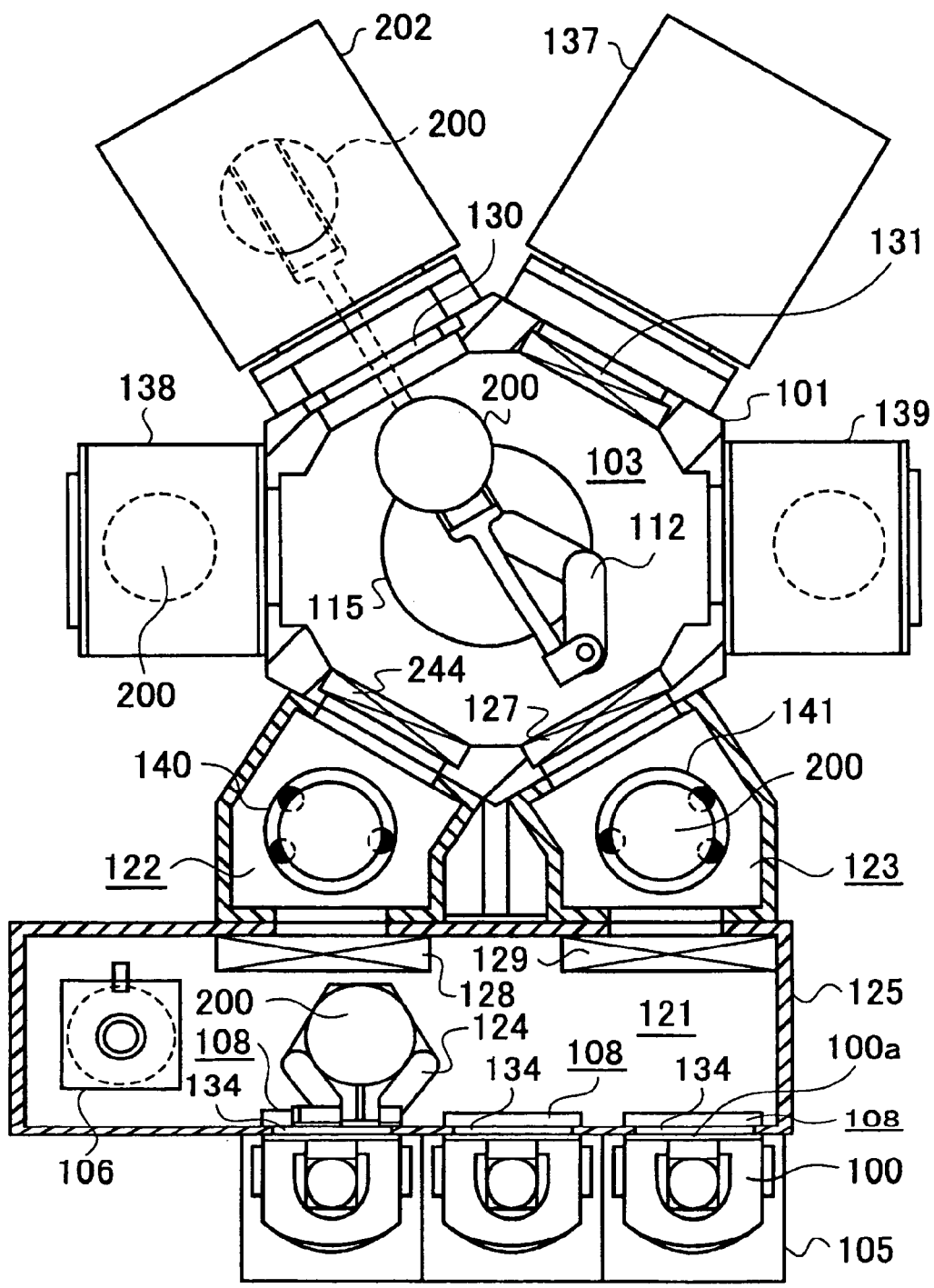
[FIG. 1]
It is a plan view of a substrate processing apparatus to which the invention is applied, partially including a section view.
Figure 2:
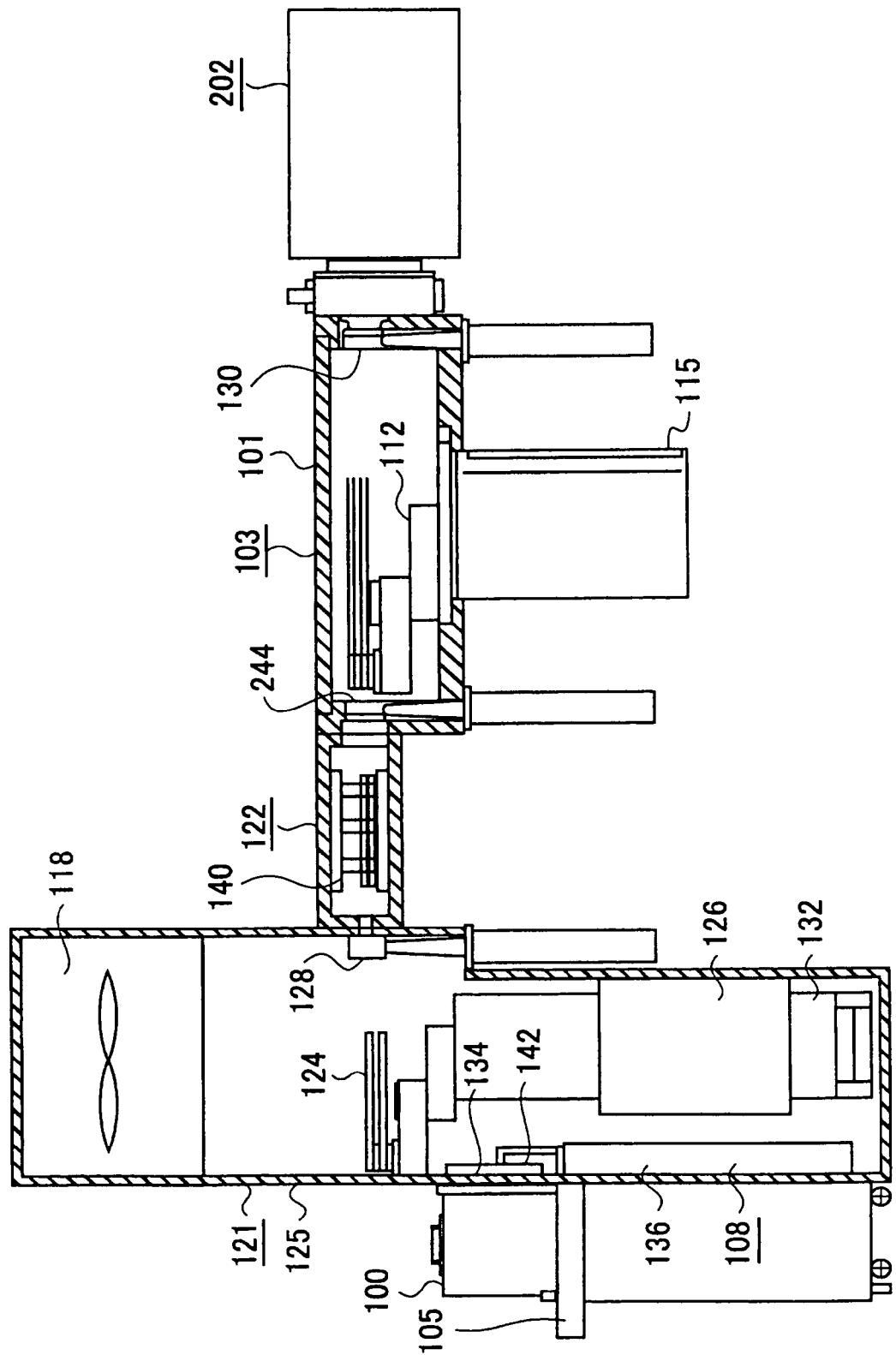
[FIG. 2]
It is an elevation view of a substrate processing apparatus to which the invention is applied, partially including a section view.
Figure 3:
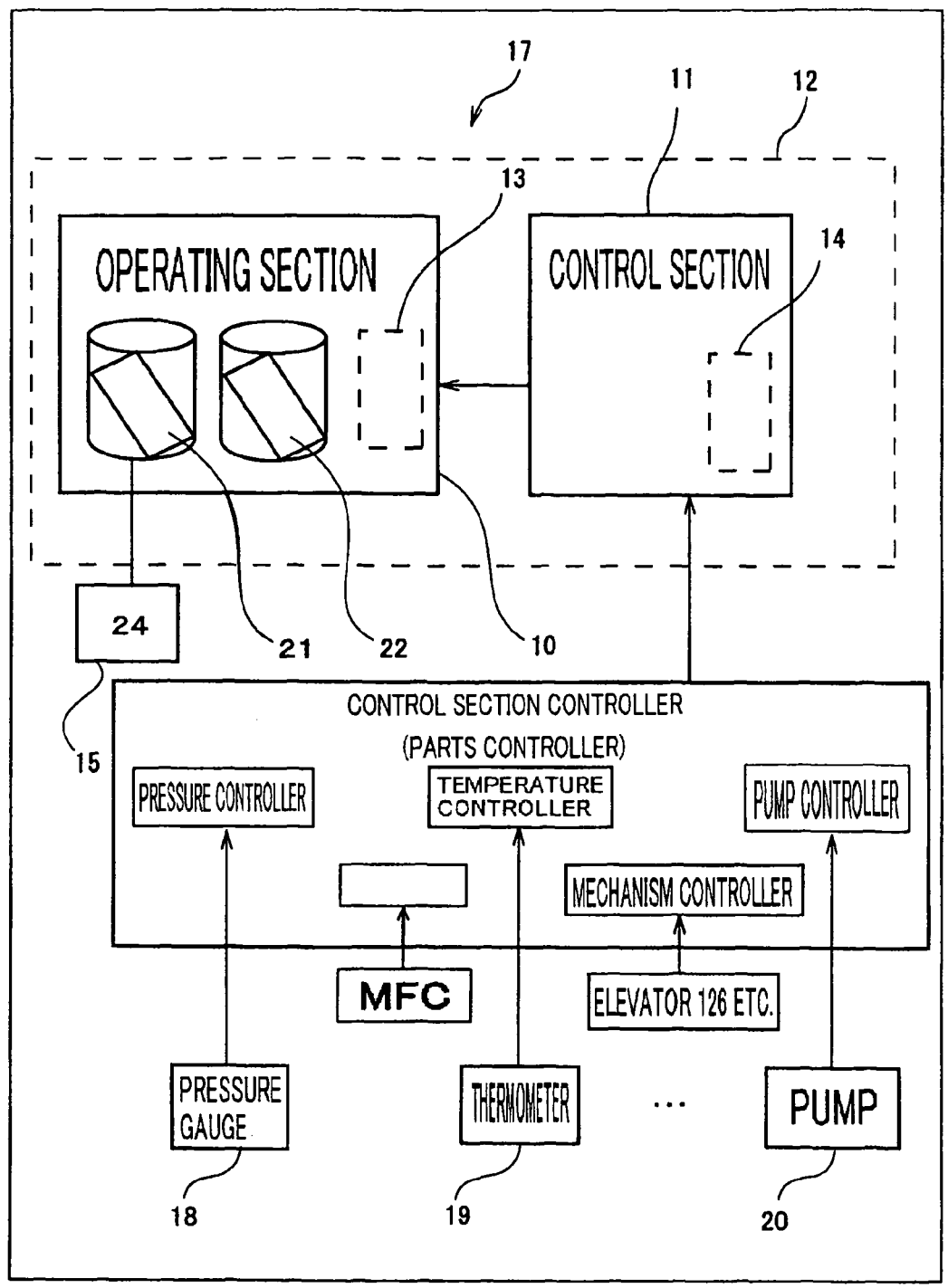
[FIG. 3]
It is a schematic diagram of a controller configuration according to a second embodiment of the invention.
Figure 4:
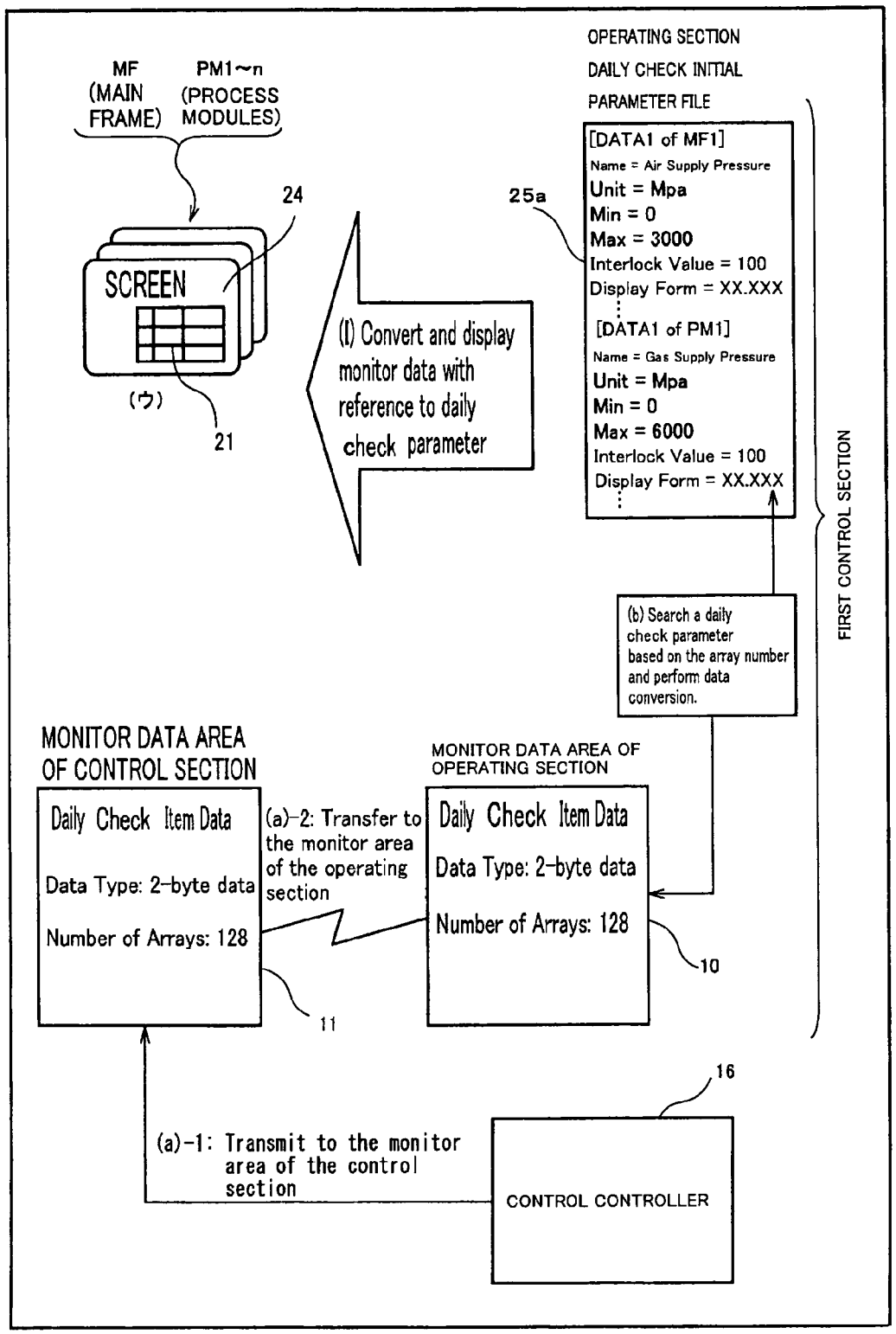
[FIG. 4]
It is an explanatory diagram showing examples of the configuration of daily check data and the routine of displaying data according to the second embodiment of the invention.
Figure 5:
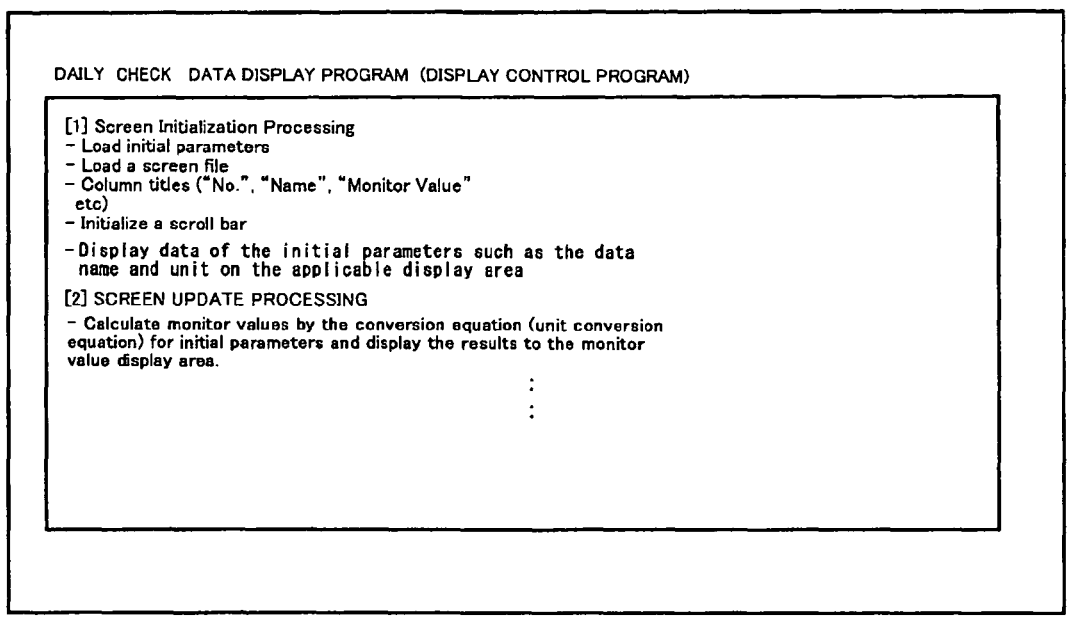
[FIG. 5]
It is a diagram showing details of a daily check data display program functioning as a display control section.
Figure 6:
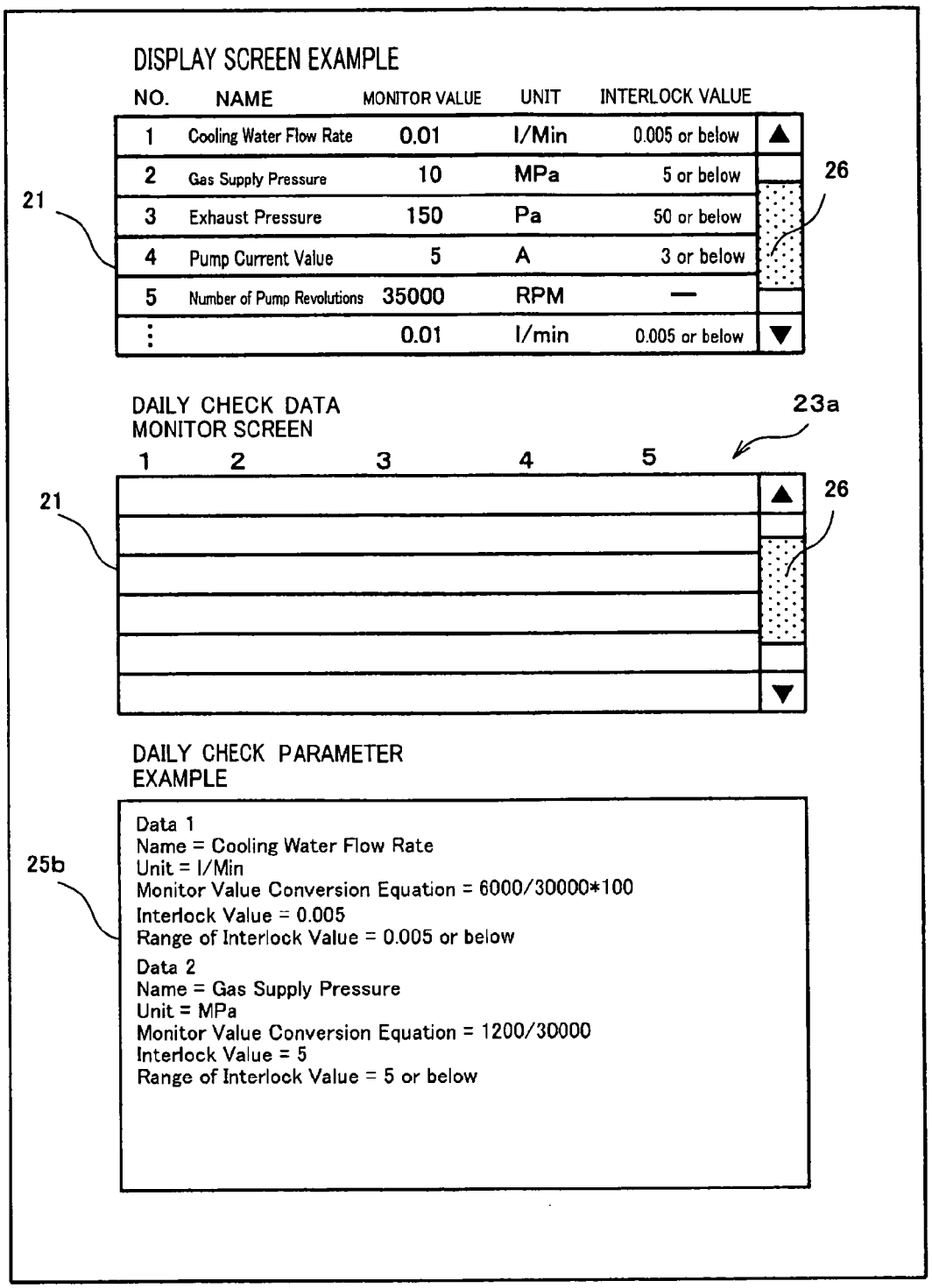
[FIG. 6]
It is an explanatory diagram showing details of a daily check data monitor screen and a daily check initial parameter file.
Figure 7:
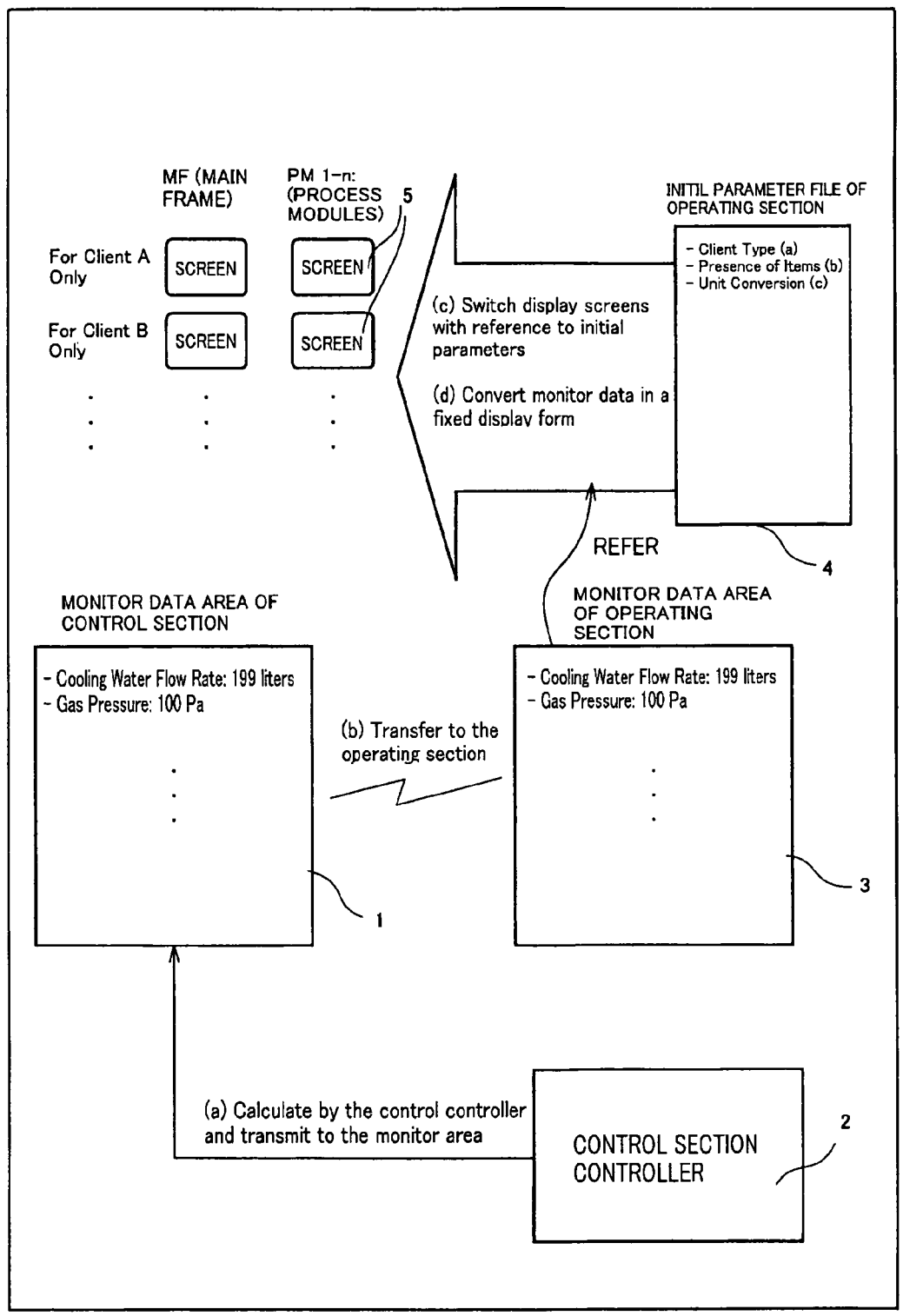
[FIG. 7]
It is a diagram showing processing of displaying utility data, which is performed with a screen and a parameter file by a program in an operating section according to a first embodiment of the invention.
Figure 12:
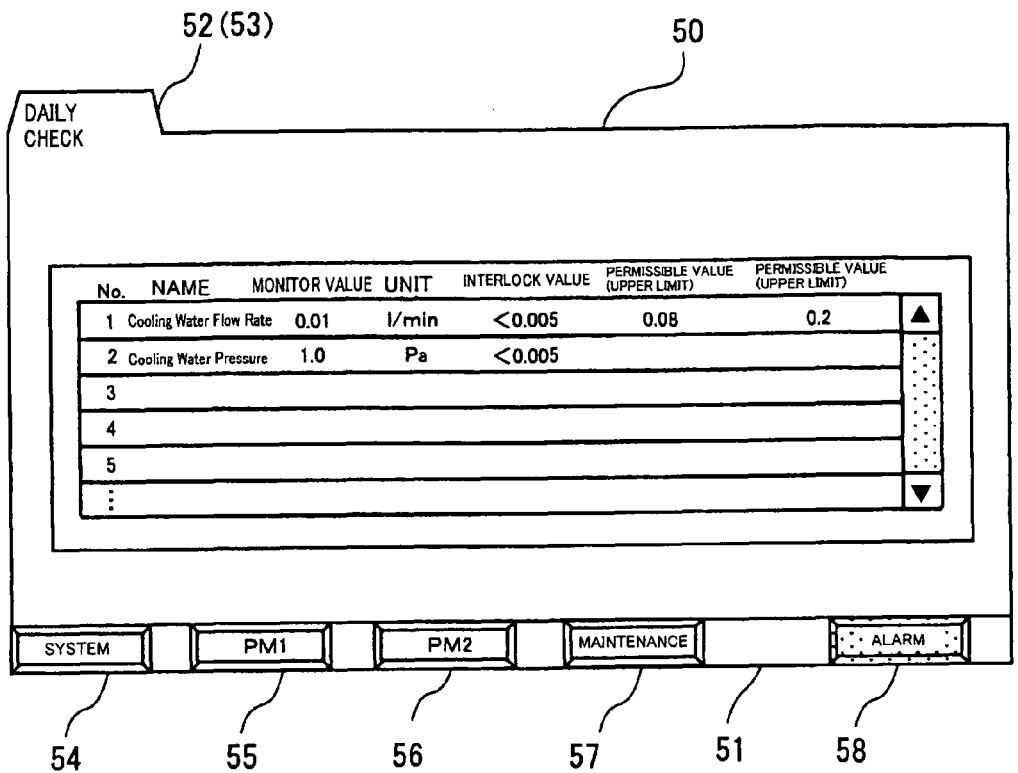
[FIG. 12]
It is an explanatory diagram showing an example of the daily check monitor screen having select buttons for screen switching and an alarm button for invoking an alarm information screen.
Figure 13:
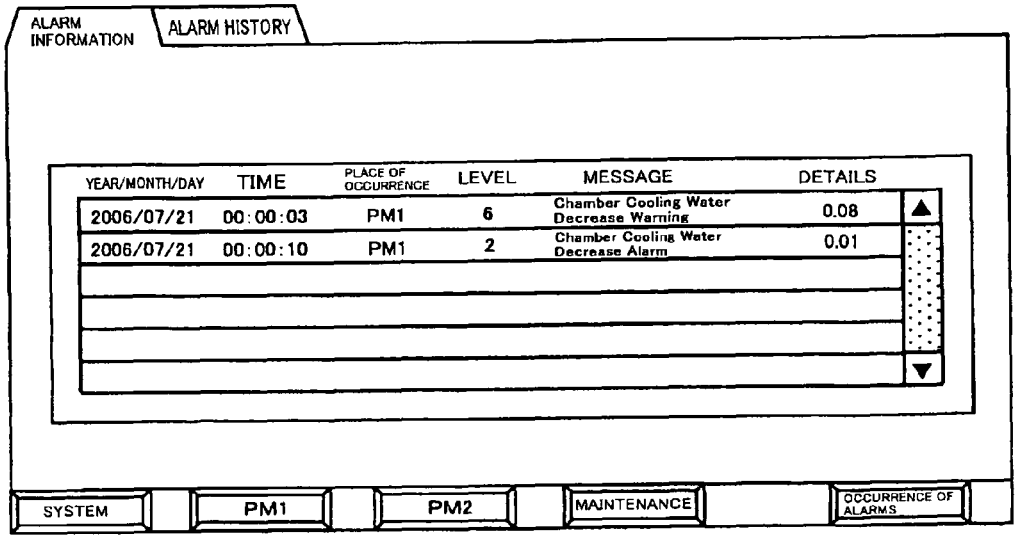
[FIG. 13]
It is an explanatory diagram showing an example of the alarm information screen.

10 Operating Section (First Control Section)
11 Control Section (First Control Section)
12 Apparatus Controller
15 Monitor (Display Unit)
16 Control Section Controller (Second Control Section)
21 Daily Check data Monitor Screen
22 Screen File
23 Daily Check data Monitor Screen Data
24 Operation Screen
25a Daily Check Initial Parameter File

The invention claimed is:

1. A substrate processing apparatus including an operating section, the operating section comprising:
a display unit having an operation screen;
a screen file that stores daily check data monitor screen data, in which a row number is settable as a data number, and a data name is settable as item data of a daily check; and
a daily check initial parameter file that stores parameter data corresponding to at least the item data,
wherein the operating section displays the daily check data monitor screen data by extracting the screen file and placing the daily check data monitor screen data on the operation screen as a daily check data monitor screen, and by extracting the daily check initial parameter file, searching through the daily check initial parameter file based on the data number, and placing parameter data corresponding to the item data on the operation screen as the daily check data monitor screen.

2. The substrate processing apparatus according to claim 1, wherein the daily check initial parameter file is constituted so that the parameter data can be rewritten.

3. The substrate processing apparatus according to claim 1, wherein the daily check initial parameter file is constituted so that the item data and the parameter data can be added.

4. The substrate processing apparatus according to claim 1, wherein the daily check initial parameter file is constituted so that name of data, permissible values, unit, and display forms for unit conversion can be added or rewritten, as parameter other than the parameter data.

5. The substrate processing apparatus according to claim 1, wherein the daily check initial parameter file has a parameter for displaying a generation of an alarm.

6. The substrate processing apparatus according to claim 5, wherein at least one of year, month and day (year, month and day of occurrence), time (time of occurrence), level (generation level), message and details is selected, as the parameter for displaying the generation of the alarm.

7. The substrate processing apparatus according to claim 1, wherein daily check data is data for checking utility equipment relating to each part.

8. The substrate processing apparatus according to claim 7, wherein the utility equipment is equipment for supplying electricity, water, gas and raw gas.

9. The substrate processing apparatus according to claim 7, wherein at least a thermometer that detects temperature, a pressure gauge that detects water pressure of cooling water of cooling water equipment, a wattmeter that detects utility data of a power supply unit, and a flow rate detector, and a pressure gauge of gas supply equipment for purge gas and dilute gas are contained as a measurement instrument of the utility equipment.

10. The substrate processing apparatus according to claim 9, wherein an interlock is provided in the measurement instrument of the utility equipment.

11. A display method of a substrate processing apparatus including an operating section, the operating section comprising:
a display unit having an operation screen;
a screen file that stores daily check data monitor screen data, in which a row number is settable as a data number, and a data name is settable as item data of a daily check; and
a daily check initial parameter file that stores parameter data corresponding to at least the item data,
wherein the operating section displays the daily check data monitor screen by extracting the screen file and placing the daily check data monitor screen data on the operation screen as a daily check data monitor screen, and by extracting the daily check initial parameter file, searching through the daily check initial parameter file based on the data number, and placing the daily check data corresponding to the item data on the operation screen as the daily check monitor screen.

12. The display method of the substrate processing apparatus according to claim 11, wherein the daily check initial parameter file is constituted so that the parameter data can be rewritten.

13. The display method of the substrate processing apparatus according to claim 11, wherein the daily check initial parameter file is constituted so that the item data and the parameter data can be added.

14. The display method of the substrate processing apparatus according to claim 11, wherein the daily check initial parameter file is constituted so that name of data, permissible values, unit, and display forms for unit conversion can be added or rewritten, as parameter other than the parameter data.

15. The display method of the substrate processing apparatus according to claim 11, wherein the daily check initial parameter file has a parameter for displaying a generation of an alarm.

16. The display method of the substrate processing apparatus according to claim 11, wherein at least one of year, month and day (year, month and day of occurrence), time (time of occurrence), level (generation level), message and details is selected, as the parameter for displaying the generation of the alarm.

17. The substrate processing apparatus according to claim 11, wherein daily check data is data for checking utility equipment relating to each part.

18. The substrate processing apparatus according to claim 17, wherein utility equipment is equipment for supplying electricity, water, gas, and raw gas.

19. The substrate processing apparatus according to claim 17, wherein at least a thermometer that detects temperature, a pressure gauge that detects water pressure of cooling water of cooling water equipment, a wattmeter that detects utility data of a power supply unit, and a flow rate detector and a pressure gauge of gas supply equipment for purge gas and dilute gas are contained as a measurement instrument of the utility equipment.

20. The substrate processing apparatus according to claim 19, wherein an interlock is provided in the measurement instrument of the utility equipment.

* * * * *